(12) United States Patent
Arunachalam et al.

(10) Patent No.: US 6,500,315 B1
(45) Date of Patent: Dec. 31, 2002

(54) METHOD AND APPARATUS FOR FORMING A LAYER ON A SUBSTRATE

(75) Inventors: Valli Arunachalam, Austin, TX (US); Peter L. G. Ventzek, Austin, TX (US); Dean J. Denning, Del Valle, TX (US); John C. Arnold, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 13 days.

(21) Appl. No.: 09/631,400

(22) Filed: Aug. 3, 2000

Related U.S. Application Data

(63) Continuation of application No. 09/425,815, filed on Oct. 25, 1999, now Pat. No. 6,139,696.

(51) Int. Cl.$^7$ .......................... C23C 16/00; C23C 14/34; H01L 21/44
(52) U.S. Cl. ................. 204/192.12; 204/192.15; 204/192.17; 204/298.06; 204/298.11; 118/723 AN; 118/723 I; 156/345.48; 427/569; 427/576; 438/597; 438/652; 438/656; 438/685
(58) Field of Search ..................... 204/192.12, 192.15, 204/192.17, 298.06, 298.11; 118/723 AN, 723 E, 723 ER, 723 I, 723 IR; 156/345, 345.48; 438/597, 652, 656, 685; 427/569, 576

(56) References Cited

U.S. PATENT DOCUMENTS

| 3,935,412 A | 1/1976 | McDonough et al. ..... 219/10.49 |
| 5,680,013 A | 10/1997 | Dornfest ................ 315/111.21 |
| 5,707,498 A | 1/1998 | Ngan .................... 204/192.12 |
| 5,716,451 A | 2/1998 | Hama et al. .............. 118/723 |

FOREIGN PATENT DOCUMENTS

| WO | WO 97/42648 | 11/1997 | ............ H01J/37/32 |

OTHER PUBLICATIONS

Rossnagel et al., "Directional dna Ionized Sutter Deposition for Microelectronics Applications," Proc. of the 3rd ISSSP, Tokyo, pp. 253–260 (1995).

*Primary Examiner*—Rodney G. McDonald
(74) *Attorney, Agent, or Firm*—Robert A. Rodriguez

(57) ABSTRACT

A method and an apparatus for forming a layer on a substrate are disclosed. In accordance with one embodiment, a substrate (901) is placed into a chamber (30) that includes a coil (16) and a shield (14) wherein the coil and the shield are electrically isolated by an isolation/support member (32) having a first surface (321) that is substantially contiguous with a surface of the coil and having a second surface (322) that is substantially contiguous with a surface of the shield. A layer (1002, 1102) is then deposited onto the substrate (901).

23 Claims, 6 Drawing Sheets

METHOD AND APPARATUS FOR FORMING A LAYER ON A SUBSTRATE

This application is a continuation of 09/425,815 filed Oct. 25, 1999 now U.S. Pat. No. 6,139,696.

FIELD OF THE INVENTION

The present invention relates to the field of semiconductor device manufacturing and more particularly to methods for forming layers on a semiconductor substrate using physical vapor deposition.

BACKGROUND OF THE INVENTION

Ionized metal plasma physical vapor deposition (INP-PVD) is commonly used to deposit conductive metal and metal-containing films onto semiconductor substrates. It is particularly useful for forming layers within high aspect ratio openings. A cross-section illustrating portions of a typical IMP-PVD chamber design is shown in FIG. 1. The cross-section includes a chamber 10, a sputtering target 12, a shield 14, a coil 16, a pedestal 18, and a semiconductor substrate 19. During normal operation, the target 12 is biased such that ions from a plasma are accelerated towards the target, whereby they strike it and "sputter" atoms off of the target and onto the substrate 19, thereby forming a layer on the substrate 19. The coil 16 provides a variety of functions during the IMP-PVD deposition process including generating ions that sputter the target 12, heating electrons in the plasma so they can more efficiently ionize gas molecules, and additionally, ionizing atoms sputtered from the target and providing an additional sputtering source for depositing material onto the substrate.

FIG. 2 includes a top-down view of the IMP-PVD chamber shown in FIG. 1 illustrating portions of the shield 14, the coil 16, and the semiconductor substrate 10. Additionally included in FIG. 2 are ceramic support pins 22, which electrically insulate the coil 16 and the shield 14, and ceramic feed through pins 24. In addition to electrically insulating the coil 16 and the shield 14, the ceramic feed through pins 24 serve as conduits for electrically coupling the coil 16 to an external power source. Additionally, the ceramic support pins 22 and feed through pins 24 physically support the coil 16 in the chamber and are the coil's primary heat transfer agent (i.e. the primary source for dissipating heat generated by the coil) during the deposition process. Prior art IMP-PVD chambers that utilize coils and ceramic pins 22 and 24 may be adequate for low coil power applications (less than 2.5 kilowatts), however they may not be suitable for higher coil power applications (greater than 2.8 kilowatts).

Increasing the power applied to the coil has been found to have a number of processing advantages. Increasing the coil power increases the number of ionized species available at the substrate surface, which can improve the step coverage and uniformity of the layer being deposited. This can be particularly useful for depositing films such as copper films and copper barrier films into high aspect ratio openings. In addition, the increased coil power increases the overall deposition rate, which has the potential for increasing process throughput and providing additional process control. However, increasing the power applied to the coil using the prior art chamber configuration can also negatively impact processing because the increase in power can uncontrollably heat the coil. This can undesirably affect the deposition process and negatively impact the mechanical integrity of the coil. The uncontrolled changes in the coil temperature can influence the grain size and sputter rate of the coil's material and correspondingly produce uncontrolled changes in the uniformity and step coverage of the deposited film. This necessitates using throughput-limiting cooling steps during deposition process to prevent coil overheating. Finally, the prior art ceramic pin chamber configuration may be insufficient for controlling or preventing electrical coupling between the coil 16 and the shield 14 which can become problematic at higher coil powers

BRIEF DESCRIPTION OF THE FIGURES

The features and advantages of the present invention will be more clearly understood from the following detailed description taken in conjunction with the accompanying FIGURES where like numerals refer to like and corresponding parts and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

The present invention relates to a method and apparatus for forming a layer on a substrate. The method comprises placing the substrate into a chamber and depositing the layer onto the substrate. The chamber includes a coil and a shield that are electrically isolated by an insulating material (isolation/support member). The insulating material has a first surface that is adjacent to and substantially contiguous with a surface of the coil and a second surface that is adjacent to and substantially contiguous with a surface of the shield. By "substantially contiguous" it is meant that at least about 10 percent, typically at least about 50 percent, and more typically at least about 75 percent of the first surface physically contacts a surface of the coil around the entire perimeter of the coil. The insulating material typically comprises a material having a dielectric constant in a range of approximately 2 to about 400. Such materials include alumina, aluminum nitride, metal nitrides, carbides, mica, quartz, or high-k dielectrics such as rare earth titanates or their composites, and mixtures of the aforementioned. An embodiment of the present invention will now be described with reference to the accompanying figures.

Figure 1:
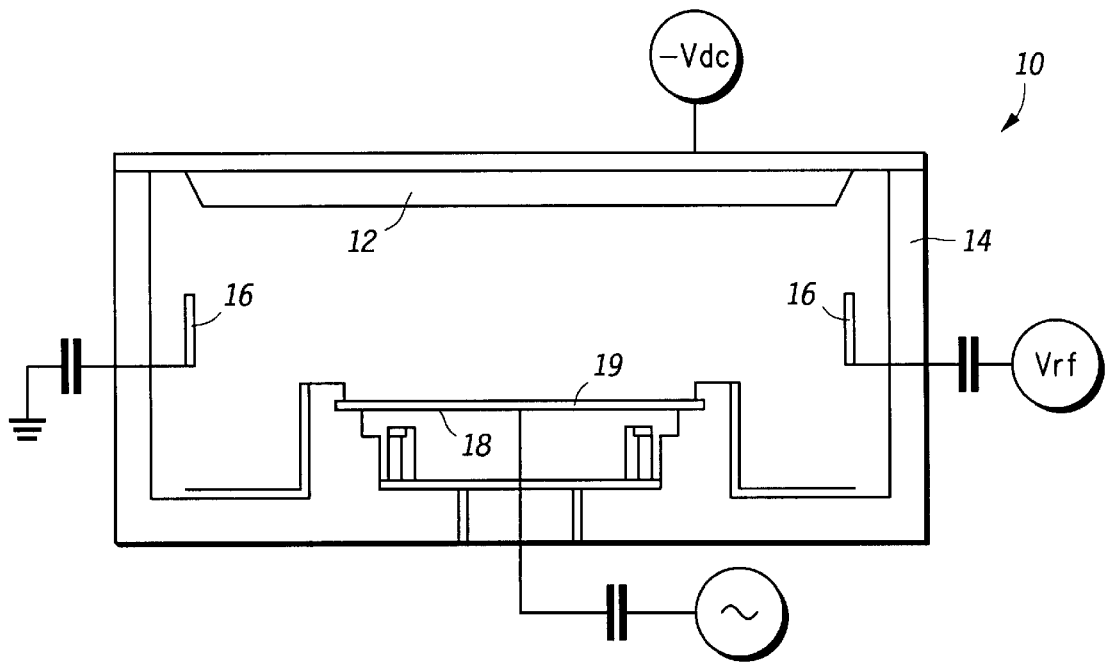
FIG. 1 includes an illustration of a cross-sectional view of a prior art IMP-PVD chamber.
Figure 2:
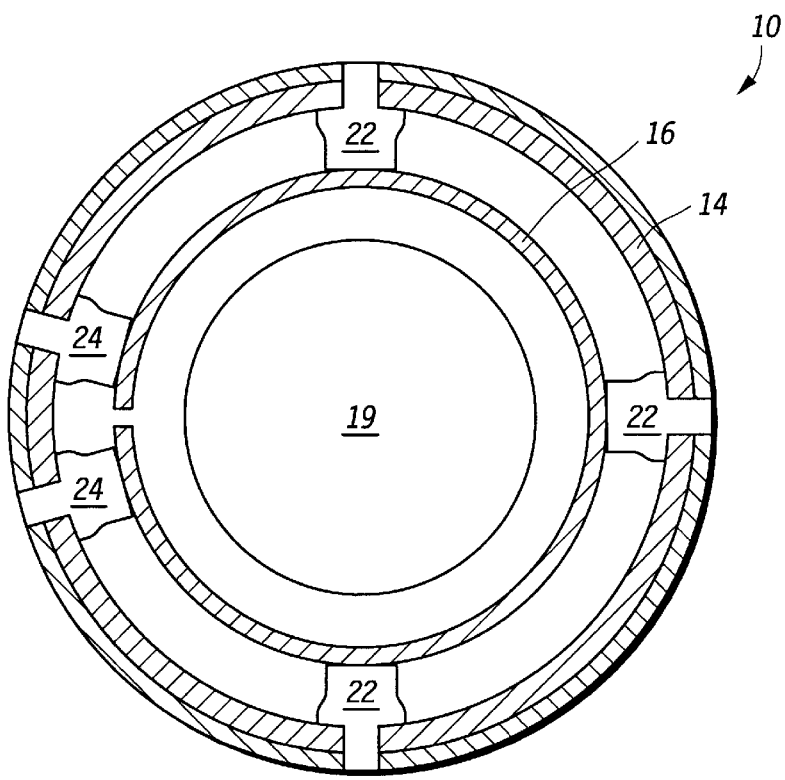
FIG. 2 includes an illustration of a top-down view of a portion of the IMP-PVD chamber shown in FIG. 1.
Figure 3:
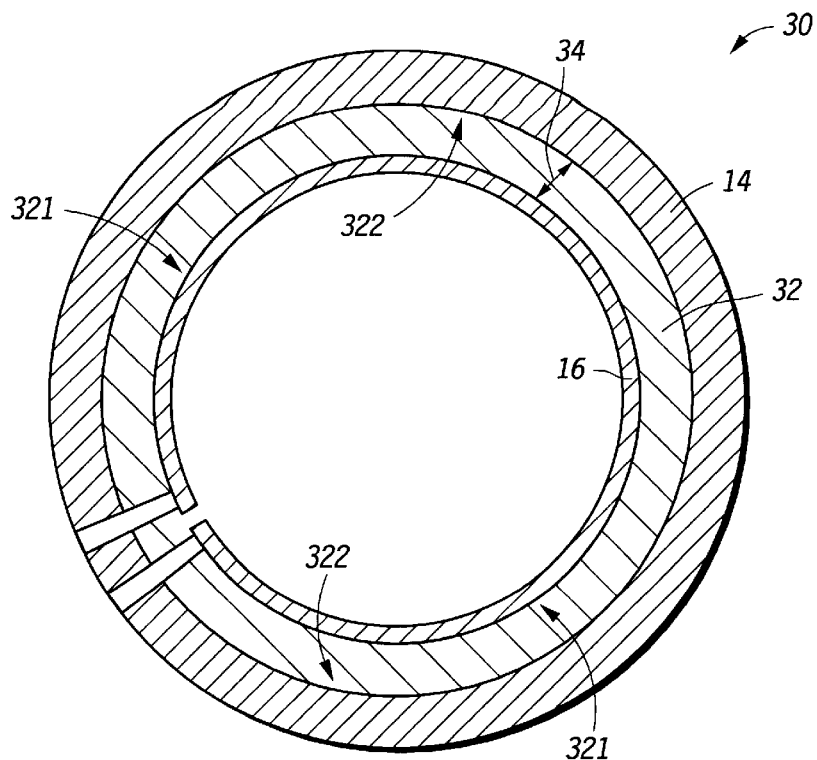
FIG. 3 includes an illustration of a top-down view of an embodiment of the present invention that includes a shield, a coil, and an isolation/support member between the shield and the coil.

FIG. 3 includes a top-down view of a portion of an IMP-PVD chamber 30 in accordance with one embodiment of the present invention. Specifically, FIG. 3 includes a shield 14, a coil 16, and an isolation/support member 32 disposed therebetween. As shown in FIG. 3, the isolation/support member 32 includes a first surface 321 that is adjacent to and substantially contiguous with a surface of the coil 14 and a second surface 322 that is adjacent to and substantially contiguous with a surface of the shield 16. Although the isolation/support member 32 shown in FIG. 3 contacts the shield 14 around its entire inner circumference and the coil around its entire outer circumference, one of ordinary skill in the art recognizes that continuous contact between the coil 16, the isolation/support member 32 and the shield may not necessarily be a requirement for realizing benefits of embodiments of the present invention.

It is desirable that the isolation/support member 32 includes a material that has heat transfer characteristics that are better than a material such as air, for example, or a vacuum. It may also desirable that the isolation/support member 32 includes a dielectric material having specific dielectric properties, a magnetic material having specific magnetic properties, or a combination thereof. In addition, it is also desirable that the isolation/support member 32 be capable of physically supporting the coil 16 within the chamber 30. For the purposes of this specification, materials having specific dielectric properties include materials having a dielectric constant in a range of approximately 2–400, and materials having specific magnetic properties include materials having a magnetic permeability in a range of approximately 100–1000. Materials having specific dielectric properties can include such materials as alumina, aluminum nitride, metal nitride, carbides, mica, quartz, or high-k dielectrics such as rare earth titanates or their composites, and mixtures of the aforementioned. Materials having specific magnetic properties can include materials such as nickel-zinc spinel ferrite materials (soft-ferrites) that are commercially used as high frequency core materials. Alternatively, other magnetic materials could be used. One of ordinary skill in the art recognizes that hard ferrites that retain magnetization may be undesirable for this application.

The composition and design of the isolation/support member 32 can vary depending on a variety of factors. Such factors include, for example, the composition of the coil and the sputtering target and the heat conduction and electrical isolation desired for a particular application. In general the isolation/support member 32 should be capable of electrically isolating the coil 16 from the shield 14. In addition, it may be desirable that the isolation/support members 32 have improved heat transfer characteristics, i.e. dissipates heat better than the virtual vacuum that occupies the majority of the space between the coil and the shield in the prior art. Additionally, it may be desirable that the isolation/support member 32 be capable of inhibiting radio frequency (RF) coupling between the coil and the shield. In accordance with one embodiment, the composition of the isolation/support member 32 and the width dimension 34 can be engineered such that the azimuthal electric field contribution from the coil diminishes to a negligible value near the shield, thereby mitigating inductive coupling between the coil and the shield. In addition, it may be desirable that the isolation/support members 32 include magnetic materials that are capable of reflecting electromagnetic energy generated by the coil in a direction away from the shield (i.e. back into the plasma).

Using materials that transfer or conduct heat more efficiently than the prior art's ceramic pins can reduce the coil's tendency to overheat at high power settings. Reducing the tendency to overheat improves the mechanical integrity of the coil as well as reduces the likelihood that the grain structure of the coil, and corresponding deposition characteristics, undesirably change. Additionally, the improved heat transfer reduces the need to use cool down steps during the deposition process and improves processing throughput. Furthermore, the ability to transfer heat more efficiently also improves the ability to control the coil's temperature and also allows the coil to be operated at higher power settings, which increases the deposition rate and similarly translates to an increase in throughput. It may also be advantageous in some applications to additionally include materials in the isolation/support member 32 that have magnetic characteristics capable of reflecting electromagnetic fields away from the shield and back into the plasma, thereby increasing the magnetic flux in the plasma. In this manner, the power applied to the coil is used more efficiently.

Figure 4:
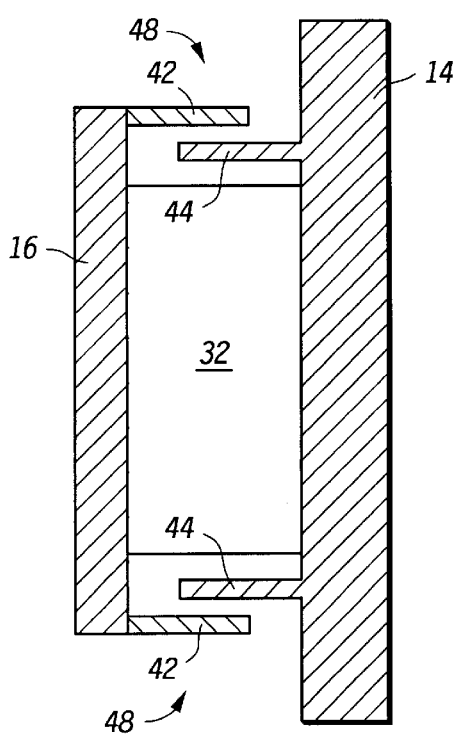
FIG. 4 includes an illustration of a cross-sectional view of a shield, a coil, and an isolation/support member in accordance with one embodiment of the present invention.

FIG. 4 includes a cross-section of portions of a coil 16, an isolation/support member 32 and a shield 14 in accordance with one embodiment of the present invention. Additionally included in FIG. 4 are outer fins (first member) 42 and inner fins (second member) 44. The outer fins 42 extend from the coil 16 toward the shield 14 and overlap the inner fins 44, which extend from the shield 14 toward the coil. As shown in FIG. 4, the inner fins 44 are positioned between the isolation/support member 32 and the outer fins 42. The combination of the outer fins 42 and inner fins 44 form traps 48 adjacent to exposed surfaces of the isolation/support member 32 that otherwise may be subject to deposition of sputtered material. The traps 48 prevent sputtered material from being deposited onto the isolation/support member 32, thereby preventing the formation of a conductive bridge between the shield and coil. The traps 48 thus help to maintain the level of electrical isolation between the coil 16 and shield 14. In accordance with a preferred embodiment, the orientation of fins 42 and fins 44 are illustrated as being outer and inner, respectively, however one of ordinary skill in the art recognizes that their relative positions can be reversed such that the fins 44 extending from the shield can form the outer fins and the fins 42 extending from the coil 16 can form the inner fins. The traps 26 may be comprised of any suitable material. Suitable materials are preferably those that maintain the desired level of electrical isolation as described above. Such materials include both non-conductive materials and conductive materials. It may be desirable to use non-conductive materials for the traps 48 so as to reduce the potential for arcing or capacitive coupling effects between the coil and shield.

Figure 5:
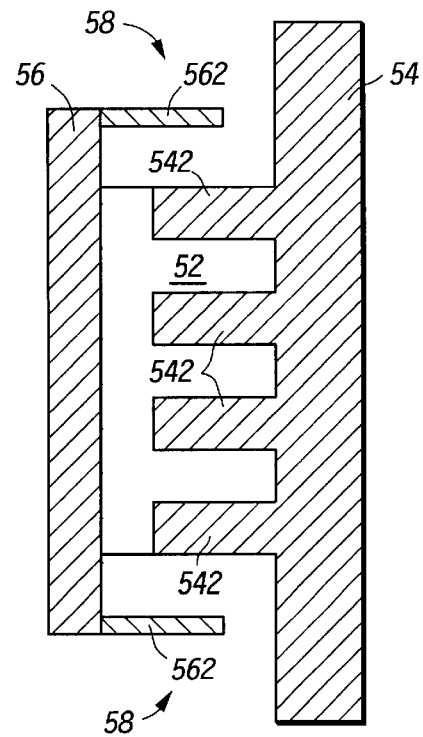
FIG. 5 includes an illustration of a cross-sectional view of a shield, a coil, and an isolation/support member in accordance with an alternate embodiment of the present invention.

FIG. 5 illustrates a cross-section of alternative embodiment, which includes a coil 56, isolation/support member 52, shield 54, traps 58, and fins (thermally conducting members) 542 extending from the shield 54 toward the coil 56 and disposed within the isolation/support member 52. As shown in FIG. 5, the fins 542 are electrically isolated from the coil 56. In accordance with one embodiment, the combination of the fins 562 extending from the coil 56 and the outermost fins 542 extending from the shield form a trap 58, similar to the trap 48 described in FIG. 4. The materials used to form the isolation/support member 52 are similar to the materials used to form the isolation/support member 32 shown in FIG. 3. The fins 542 can be formed using materials that are similar to or different from the material used to form the shield 54. In addition, the fins can include magnetic materials. The embodiment shown in FIG. 5 provides an increased shield 54 surface area adjacent the coil 56. The increased shield 54 surface area can improve the chamber's ability to dissipate heat generated by the coil. The improved ability to dissipate heat has the associated advantages described above in regard to FIG. 3.

Figure 6:
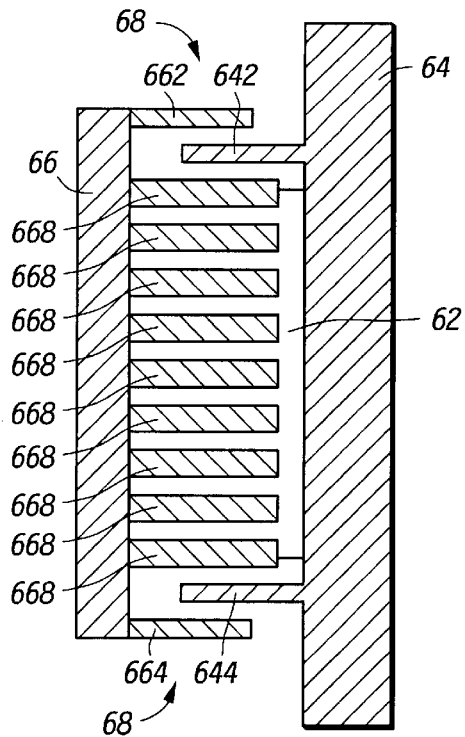
FIG. 6 includes an illustration of a cross-sectional view of a shield, a coil, and an isolation/support member in accordance with another alternate embodiment of the present invention.

FIG. 6 illustrated a cross-section of an alternative embodiment, wherein the coil 66 includes additional fins 668 (thermally conducting members) extending toward the shield 64 and disposed within the isolation/support member 62. The fins 668 can be formed using materials that are similar to or different from those used to form the coil 66. Additionally, the fins 668 can include magnetic materials. The combination of the coil's outermost fins 662 and 664 and the shield's fins 642 and 644 form traps 68 similar to the traps 48 described previously in FIG. 4. The isolation/support member 62 can include materials that are similar to the materials used to form the isolation/support member 32 described in FIG. 3. In this embodiment, the additional coil 66 surface area provided by the fins 668 improves the chamber's ability to dissipate heat generated by the coil. The improved ability to dissipate heat has the associated advantages described above in regard to FIG. 3.

Figure 7:
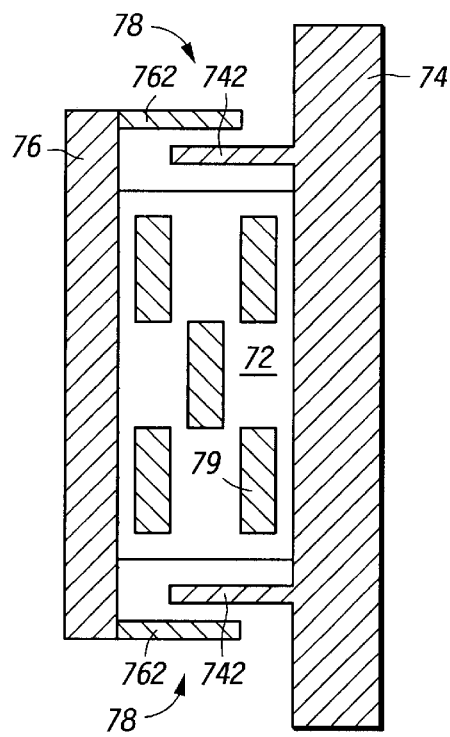
FIG. 7 includes an illustration of a cross-sectional view of a shield, a coil, and an isolation/support member in accordance with another alternate embodiment of the present invention.

FIG. 7 illustrates a cross-section of an alternative embodiment, showing a coil 76, isolation/support member 72, shield 74, traps 78 that include fins 762 and 742 and inserts 79 disposed or suspended within the isolation/support member 72. The isolation/support member 72 can include materials similar to the materials used to form the isolation/support member 32 described in FIG. 3. The inserts 79 typically include materials that readily conduct heat. They can include dielectric materials, magnetic materials, metallic materials, or combinations thereof, such as nanocomposites, which can include any or all of dielectric, magnetic and metal materials. The inserts 79 are advantageous in that not only do they improves the chamber's ability to dissipate coil generated heat, they can additionally be configured to form a faraday shield that reflects electromagnetic energy generated by the coil back into the plasma. In yet another embodiment, instead of using inserts 78, a metallic or magnetic mesh material can alternatively be suspended in the isolation/support member 72 to provide similar advantages.

Figure 8:
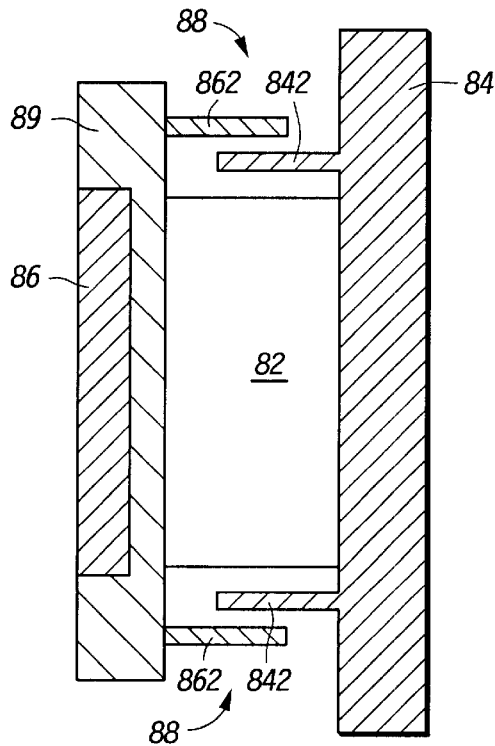
FIG. 8 includes an illustration of a cross-sectional view of a shield, a coil, and an isolation/support member in accordance with yet another alternate embodiment of the present invention.

FIG. 8 includes yet another alternative embodiment showing a coil 86, a shield 84, isolation/support member 82, traps 88 that comprise fins 862 and 842, and reflector 89. The isolation/support member 82 can include materials that are similar to the materials used to form the isolation/support member 32 described in FIG. 3. In accordance with one embodiment the coil 86 is disposed adjacent to or within the reflector 89, as shown in FIG. 8. In accordance with a specific embodiment, the reflector substantially covers surface portions of the coil exposed to the shield, the substrate, and a sputtering target. The reflector 89 includes a magnetic material that reflects electromagnetic energy, such as an RF electric field generated by the coil, back into the plasma. One of ordinary skill in the art recognizes that the dimensions and shape of the reflector relative to the coil can be configured to maximize the reflected electromagnetic energy, thereby improving overall processing efficiency.

Figure 9:
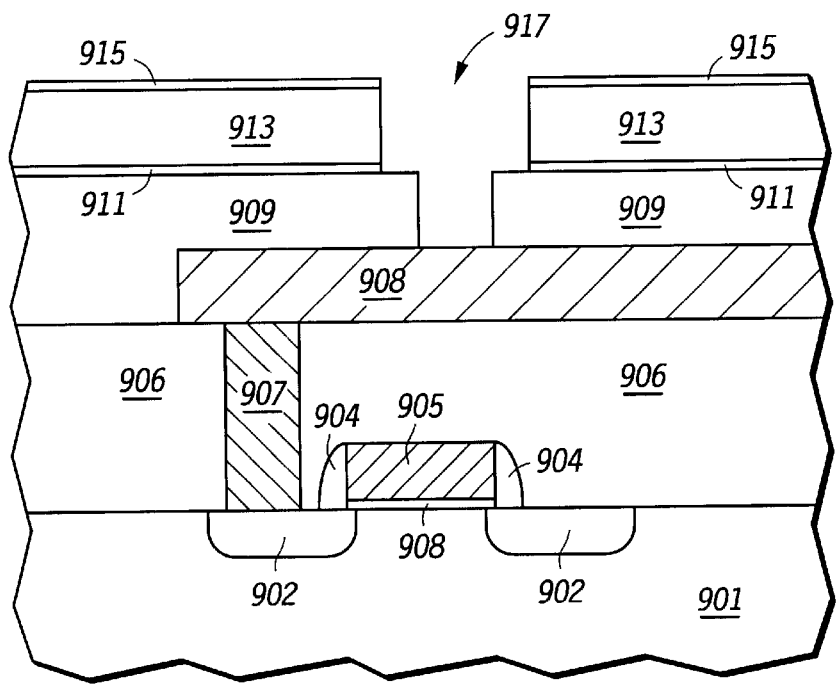
FIG. 9 includes an illustration of a cross-sectional view of a semiconductor device substrate that has been partially processed to form a dual inlaid opening.

FIGS. 9–13 additionally describe a method of forming a semiconductor device using an embodiment of the present invention. FIG. 9 includes a cross section of a partially processed semiconductor device that includes semiconductor substrate 901. In accordance with one embodiment, semiconductor substrate 901 is a monocrystalline semiconductor substrate. Alternatively, semiconductor substrate 901 can be a silicon-oninsulator substrate or any other substrate used to form a semiconductor device. Source and drain regions 902 are formed within the semiconductor substrate 901. The source and drain regions 902 are formed using conventional implant and diffusion processes. Overlying substrate 901 are gate dielectric layer 903, gate electrode 905, and spacers 904. The gate dielectric layer 903, gate electrode 905, and spacers 904 are formed using conventional materials and processes.

Interlevel dielectric (ILD) layer 906 is formed over the semiconductor substrate 901, gate electrode 905 and spacers 904. Formed within the ILD layer 906 is a conductive plug 907. In accordance with one embodiment, ILD layer 906 is a layer of chemically vapor deposited silicon oxide that is formed using tetraethylorthosilicate (TEOS) as source gas. Alternatively ILD 906 can be formed using fluorinated TEOS (FTEOS), borophospholsilicate glass (BPSG), borophospho-TEOS (BPTEOS), silicon oxynitride, a low dielectric constant material (low-k), or the like (for the purposes of this specification, a low dielectric constant material is any material with a dielectric constant less than approximately 3.5). Conductive plug 907 is typically formed using polysilicon or tungsten. Overlying the conductive plug 907 and the ILD layer 906 is an interconnect 908. The interconnect 908 is typically formed using conductive materials that can include copper, aluminum, and the like. The methods for forming ILD 906, conductive plug 907, and interconnect 908 are conventional to one of ordinary skill in the art.

Overlying the interconnect 908 and ILD 906 are ILD layers 909 and 913 and etch stop layers 911 and 915. The ILD layers 909 and 913 are formed using processes and materials similar to those used to form interlevel dielectric layer 906. The etch stop layers 911 and 915 typically include materials such as silicon nitride, silicon oxynitride, plasma enhanced nitride, or any other such material that the ILD layers 909 and 913 can be etched selectively with respect to. In accordance with one embodiment of the present invention, the etch stop layers 911 and 915 and ILD layers 909 and 913 have been patterned and etched to form a dual inlaid opening 917, as shown in FIG. 9. The method for forming the dual inlaid opening 917 is known in the art.

Figure 10:
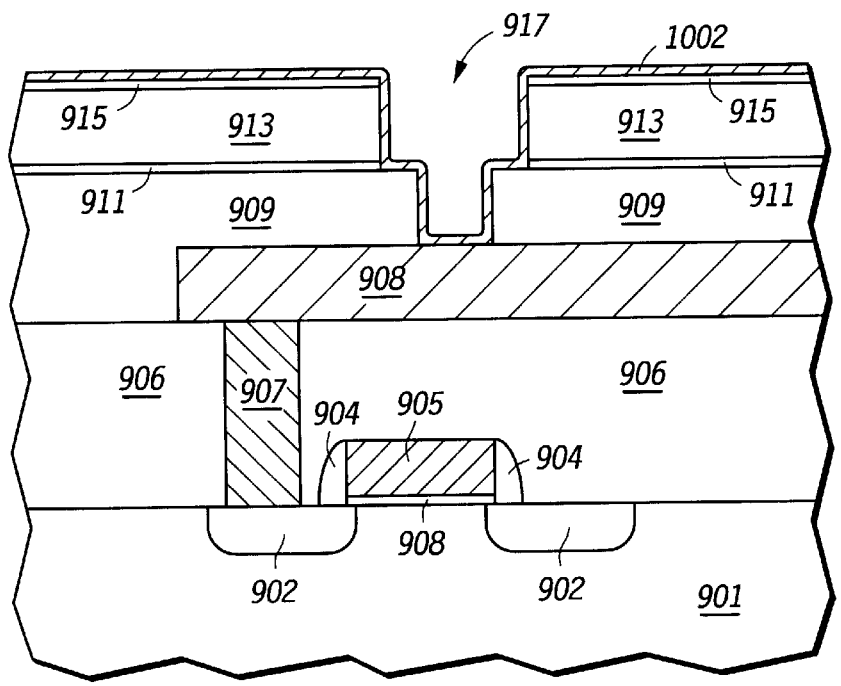
FIG. 10 includes an illustration of a cross-sectional view of the substrate shown in FIG. 9 and additionally includes a barrier layer formed using an embodiment of the present invention.

Shown in FIG. 10 is a cross-section of the semiconductor device substrate shown in FIG. 9 that additionally includes a barrier layer 1002 formed overlying the substrate and within the dual inlaid opening 917. In accordance with one embodiment, the barrier layer 1002 is formed using an IMP-PVD processing chamber configured with a shield, coil and isolation/support member similar to those described previously in FIGS. 3–8, or variations thereof. In accordance with one embodiment, the barrier layer 1002 includes a refractory metal containing material, such as tantalum, titanium, tungsten, tantalum nitride, titanium nitride and the like. The thickness of the barrier layer 1002 within the inlaid interconnect opening 917 is typically greater than approximately 50 angstroms.

However, one of ordinary skill in the art recognizes that the barrier thickness is a function of the dimensions of the dual inlaid interconnect opening 917. Thus, as the dimensions of the dual inlaid interconnect opening 917 decrease, so too may the thickness of the barrier layer 1102. In accordance with one embodiment, the barrier layer is sputtered from a tantalum target while flowing nitrogen and argon gas into the process chamber. During the deposition, the chamber pressure in a range of approximately 20–40 millitorr, the wafer bias is in a range of approximately 30–100 volts, and the coil power is in a range of approximately 1.0 to about 5.0 kilowatts.

Figure 11:
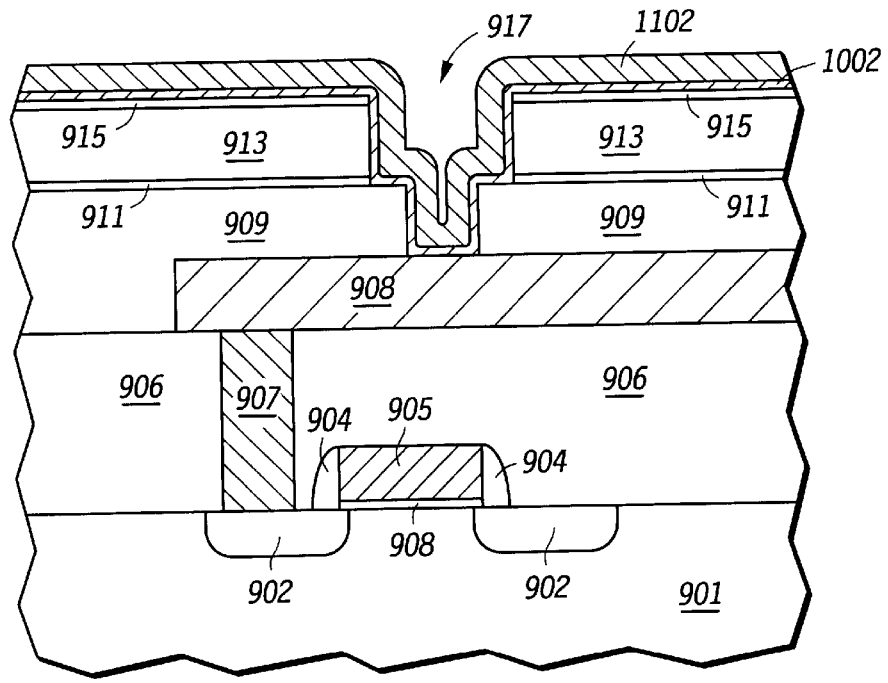
FIG. 11 includes an illustration of a cross-sectional view of the substrate shown in FIG. 10 and additionally includes a seed layer formed using an embodiment of the present invention.

Shown in FIG. 11 is a cross section of the semiconductor device substrate shown in FIG. 10 that additionally includes a seed layer 1102 formed over the barrier layer 1002. The seed layer 1102 has also been advantageously formed using an IMP-PVD processing chamber that has incorporated embodiments of the present invention. Typically the seed layer is deposited to a minimum thickness that is greater than approximately 100 Angstroms within the dual inlaid opening 917. In accordance with one embodiment, the seed layer 1102 is formed using copper. In alternative embodiments, other seed materials appropriate for forming subsequent conductive layers can be used. In accordance with one specific embodiment the copper seed layer 1102 is sputtered from a copper target while flowing argon gas into the process chamber. During the deposition, the chamber pressure in a range of approximately 10–60 millitorr, the wafer bias is in a range of approximately 0–100 volts, and the coil power is in a range of approximately 1000–5000 kilowatts.

Using embodiments of the present invention, the barrier layer 1002 and/or the seed layer 1102 can be advantageously deposited as compared to prior art deposition chambers. The power applied to the coil can be increased over that of the prior art (i.e. greater than approximately 2.5 kilowatts), thereby increasing the amount of ionized species available at the substrate surface and improving step coverage and uniformity of the barrier layer across the substrate. This becomes increasingly important as the barrier layer or seed layer thickness decreases and the aspect ratio of the opening increases to accommodate scaling of future generations of semiconductor devices. Furthermore, the deposition rate increases as a result of the increased power capabilities and improved cooling efficiency, and the throughput can be increased because the cooling steps required by the prior art are no longer necessary. Additionally, the electric field cross-coupling between the coil and the shield is reduced and processing efficiency is improved.

Another advantage of improved coil temperature control includes improved wafer-to-wafer repeatability when forming composite layers such as composite barriers (i.e. tantalum nitride and the like). The improved temperature control results in improved control over the tantalum coil's reaction with the nitrogen containing environment. This correspondingly translates to improved film thickness uniformity and resistivity of the deposited barrier film.

Figure 12:
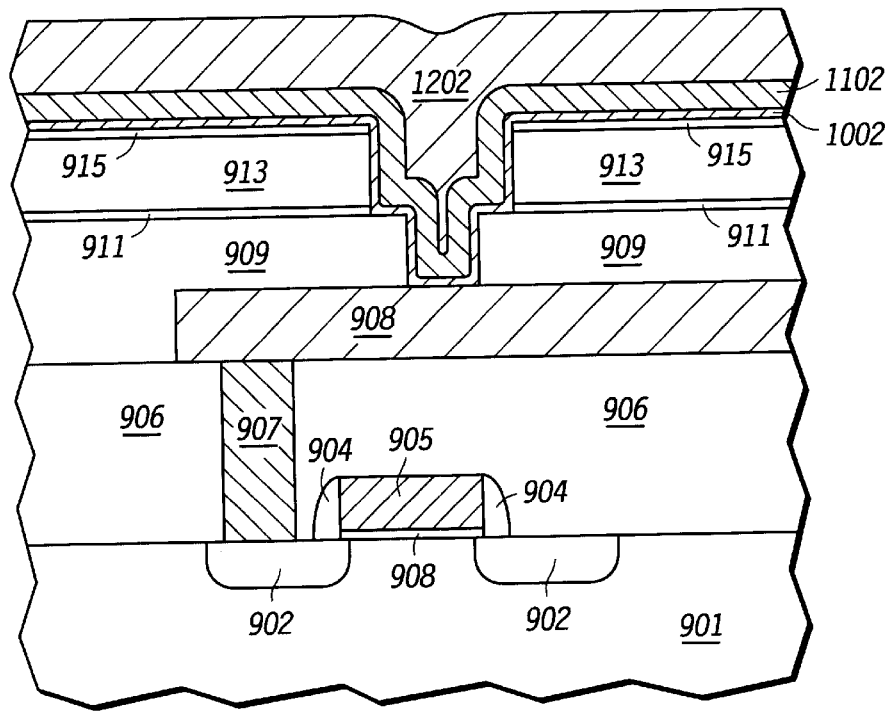
FIG. 12 includes an illustration of a cross-sectional view of the substrate shown in FIG. 11 after forming a copper layer over the seed layer.
Figure 13:
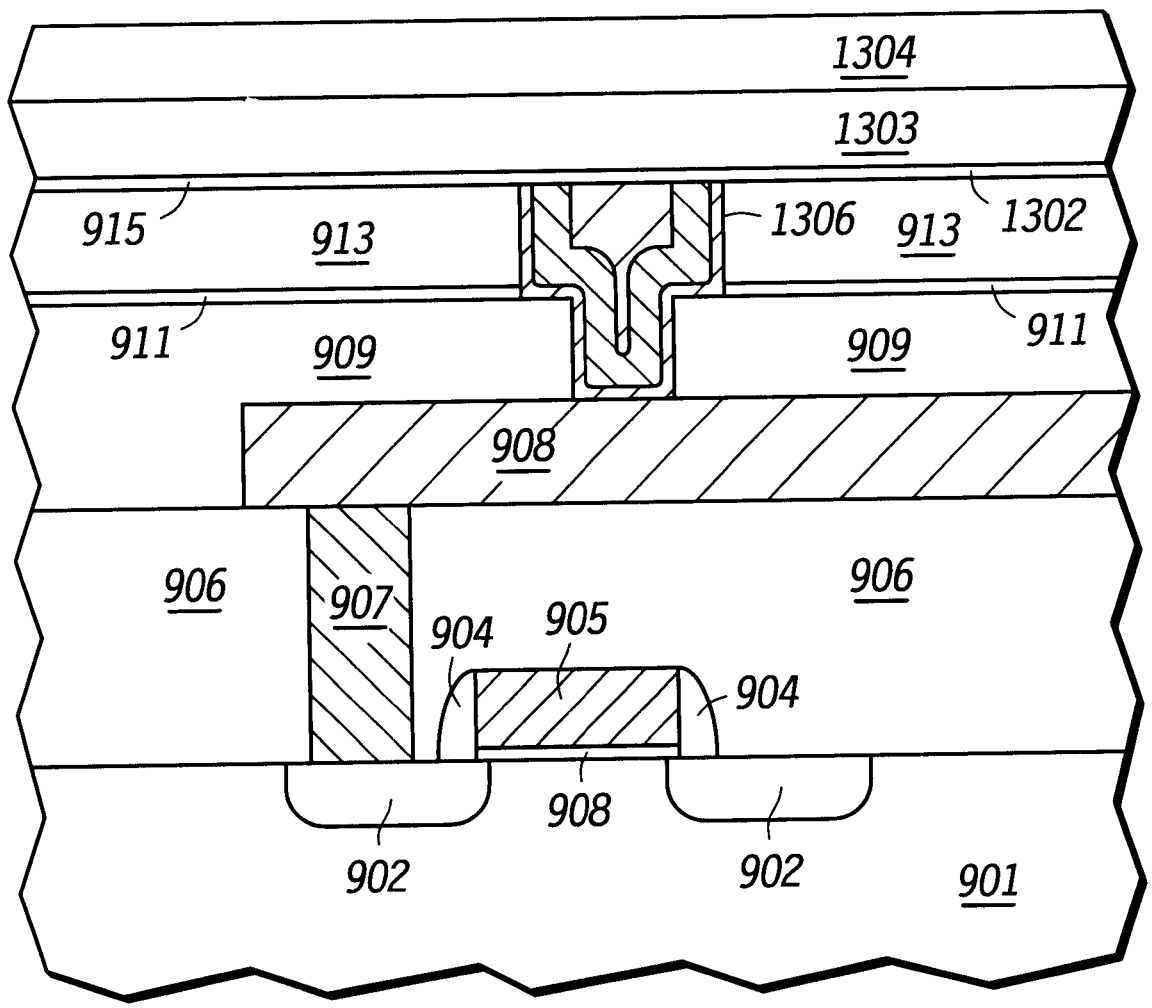
FIG. 13 includes an illustration of a cross-sectional view of a substantially completed semiconductor device.

FIG. 12 further illustrates that a conductive copper-fill material 1202 has been deposited over the copper seed layer 1102 to substantially fill the dual inlaid interconnect opening 917. Typically, the copper fill material 1202 is deposited using electroplating. Alternatively, the copper layer can be formed using PVD, CVD, electroless plating, or the like. Shown in FIG. 13 is a cross section of a substantially completed semiconductor device. In accordance with one embodiment, portions of the copper fill material 1202, the copper seed layer 1102, and the barrier layer 1002 not contained within the dual inlaid opening 917 have been removed using conventional chemical mechanical planarization (CMP) processes to form a dual inlaid interconnect 1306. Overlying the dual inlaid interconnect 1306 is a capping layer 1302. Typically the capping layer 1302 is formed using a silicon nitride containing material. Alternatively, the capping material can be formed using any material that adequately adheres to the copper interconnect and layer 1302 is a passivation layer 1303. The passivation layer 1303 is typically formed using plasma-enhanced nitride, silicon oxynitride or a combination thereof. Overlying the passivation layer 1303 is a polyimide layer 1304. The thickness and methods for depositing the capping layer 1302, the passivation layer 1303, and the polyimide layer 1304 are conventional. Typically, the passivation layer 1303 and the polyimide layer 1304 are the uppermost layers of a semiconductor device. In accordance with other embodiments, additional interconnect structures and dielectric layers may be formed in order to fabricate a more complicated semiconductor device.

In addition, embodiments of the present invention can be readily extendable for use with virtually any film that can be deposited using IMP-PVD. These films can include but are not necessarily limited to films such as iridium, ruthenium, iridium oxide, ruthenium oxide, titanium nitride, titanium aluminum nitride, titanium silicon nitride, tantalum nitride, tantalum aluminum nitride, tantalum silicon nitride, metal nitrides, metal borides, metal carbides, platinum, palladium, rhenium, rhodium, osmium, rhenium oxide, osmium oxide, strontium ruthenate, lanthanum strontium cobalt oxide, yttrium barium copper oxide, and the like.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Benefits, other advantages, and solutions to problems have been described with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A method for forming a layer on a substrate comprising:
placing the substrate into a chamber, the chamber including a coil and a shield, wherein the coil and the shield art electrically isolated by an isolation/support member having a first surface that is substantially contiguous with a surface of the coil about an external circumference of the coil and having a second surface that is substantially contiguous with a surface of the shield about an inner circumference of the shield; and
depositing a layer onto the substrate.

2. The method of claim 1, wherein the isolation/support member includes a dielectric material having a dielectric constant greater than approximately 2.0.

3. The method of claim 2, wherein the dielectric material includes a material selected from a group consisting of alumina, metal nitride, carbides, mica, quartz, and rare earth titanates.

4. The method of claim 1, further comprising a first member extending from the coil towards the shield and a second member extending from the shield towards the coil, wherein the second member is positioned between the first member and the isolation/support member, and wherein at least a portion of the first member overlaps a portion of the second member.

5. The method of claim 1, further comprising thermally conducting members extending from the shield.

6. The method of claim 1, further comprising thermally conducting members extending from the coil.

7. The method of claim 1, further comprising a thermally conductive member disposed within the isolation/support member.

8. The method of claim 7, wherein the thermally conductive member is electrically isolated from the coil and the shield.

9. The method of claim 8, wherein the thermally conductive member includes a member selected from a group consisting of a metal insert and a metal mesh.

10. The method of claim 1, further comprising a magnetic material disposed within the isolation/support member.

11. The method of claim 10, wherein the magnetic material has a magnetic permeability in a range of 100–1000.

12. The method of claim 10, wherein the magnetic material includes a nickel-zinc spinel ferrite material.

13. The method of claim 1, wherein the layer is further characterized as a conductive layer.

14. The method of claim 13, wherein the layer includes a material selected from a group consisting of tantalum, tungsten, and titanium.

15. The method of claim 1, wherein the layer is formed within an inlaid interconnect opening selected from a group consisting of a dual inlaid interconnect opening and a single inlaid interconnect opening.

16. The method of claim 2, wherein the dielectric material includes aluminum nitride.

17. A semiconductor processing chamber comprising a coil and a shield, wherein the coil and the shield are electrically isolated by an isolation/support member having a first surface that is substantially contiguous with a surface of the coil about an external circumference of the coil and a second surface that is substantially contiguous with a surface of the shield about an internal circumference of the shield.

18. The semiconductor processing chamber of claim 17, wherein the isolation/support member includes a dielectric material having a dielectric constant in a range of approximately 2–400.

19. The semiconductor processing chamber of claim 17, wherein the isolation/support member includes a magnetic material having a magnetic permeability in a range of approximately 100–1000.

20. The semiconductor processing chamber of claim 17, further comprising a first member extending from the coil toward the shield and a second member extending from the shield toward the coil wherein the second member is positioned between the first member and the isolation/support member and wherein at least a portion of the first member overlaps a portion of the first member.

21. The semiconductor processing chamber of claim 17, further comprising thermally conducting members extending from the coil toward the shield.

22. The semiconductor processing chamber of claim 17, further comprising thermally conducting members extending from the shield toward the coil.

23. The semiconductor processing chamber of claim 17, further comprising a thermally conductive member disposed within the isolation/support member.

* * * * *